US 7,685,555 B1

(12) United States Patent
Bertrand et al.

(10) Patent No.: US 7,685,555 B1
(45) Date of Patent: Mar. 23, 2010

(54) MACRO INFERENCE WITHIN ELECTRONIC DESIGN AUTOMATION TOOLS USING HARDWARE DESCRIPTION LANGUAGE TEMPLATES

(75) Inventors: Jérôme Bertrand, Grenoble (FR); Nicolas Leignel, Grenoble (FR); Thomas Vuillermet, Chambery (FR)

(73) Assignee: Xilinx, Inc., San Jose, CA (US)

( * ) Notice: Subject to any disclaimer, the term of this patent is extended or adjusted under 35 U.S.C. 154(b) by 346 days.

(21) Appl. No.: 11/787,927

(22) Filed: Apr. 18, 2007

(51) Int. Cl.
*G06F 17/50* (2006.01)
(52) U.S. Cl. .............................. 716/18; 716/3
(58) Field of Classification Search ............ 718/18; 716/18, 3
See application file for complete search history.

(56) References Cited

U.S. PATENT DOCUMENTS

| 5,867,400 A * | 2/1999 | El-Ghoroury et al. ........... 716/1 |
| 5,883,814 A * | 3/1999 | Luk et al. ....................... 716/2 |
| 6,195,593 B1 * | 2/2001 | Nguyen ....................... 700/97 |

* cited by examiner

*Primary Examiner*—Jack Chiang
*Assistant Examiner*—Brandon W Bowers
(74) *Attorney, Agent, or Firm*—Kevin T. Ouenot (57) ABSTRACT

Within an Electronic Design Automation (EDA) tool, a method of macro inference can include translating a hardware description language (HDL) template into a macro template and translating a circuit design into a format corresponding to the macro template. The method further can include matching a portion of the translated circuit design with the macro template and replacing the portion of the circuit design matching the macro template with a macro associated with the macro template. The resulting updated circuit design is then output, e.g., to a user, a computer file, or another EDA tool.

18 Claims, 5 Drawing Sheets

FIG. 1

```
       ⎧ Module counter (clock, reset, out);
       ⎪
       ⎪ Input clock, reset;
       ⎪ Output [0:7] out;
       ⎪
       ⎪ always@ (posedge clock)
       ⎪ begin
   105 ⎨   if (reset)
       ⎪     out <= 0;
       ⎪   else
       ⎪     out <= out + 1;
       ⎪ end
       ⎪
       ⎩ endmodule
```

FIG. 2

```
(* macro_name = "MAC", activation_switch = "mac_extract" *)

module mac (A,B,CLK,RST,O);

parameter integer SIZEA = 4;
parameter integer SIZEB = 4;
parameter integer SIZEO = 6;

(* size = "A", min_size = "8", max_size = "18" *) input [1:SIZEA] A;
(* size = "B", min_size = "8", max_size = "18" *) input [1:SIZEB] B;
(* reset_optionnal, min_size = "A+B", max_size = "48" *) output reg [1:SIZEO] O;
input CLK,RST;

(* optionnal, reset_optionnal *) reg [1:SIZEA] buf_A;
(* optionnal, reset_optionnal *) reg [1:SIZEB] buf_B;

always@(posedge (CLK))
  if (! (* optionnal *) RST)
    begin
      (* any_constant *) buf_A <= 0;
      (* any_constant *) buf_B <= 0;
    end
  else
    begin
      buf_A <= A;
      buf_B <= B;
    end always@(posedge (CLK))
  if (! (* optionnal *) RST)
    (* any_constant *) O <= 0;
  else
    O <= O + (buf_A * (* template_start *) buf_B);

endmodule
```

MACRO INFERENCE WITHIN ELECTRONIC DESIGN AUTOMATION TOOLS USING HARDWARE DESCRIPTION LANGUAGE TEMPLATES

FIELD OF THE INVENTION

The embodiments disclosed herein relate to the field of Electronic Design Automation and, more particularly, to implementing circuit designs using programmable logic devices and macro inference techniques.

BACKGROUND

Software-based Electronic Design Automation (EDA) tools, in general, can process circuit designs through what is referred to as an "implementation flow". The term "implementation flow" refers to the various processes and tasks that must be performed on a circuit design to implement that circuit design within a target programmable logic device (PLD). A circuit design can be specified in programmatic form, e.g., using a hardware description language. A typical implementation flow entails various phases, or stages, such as synthesis, translation, packing, placement, and routing. After subjecting a circuit design to these phases of implementation, the resulting circuit design can be transformed into a bitstream. When loaded into a target PLD, the bitstream configures the device to implement the circuit design.

Some EDA tools provide macro functionality. The term "macro" generally refers to an implementation of a particular circuit function, e.g., a counter, a shift register, arithmetic operators, etc. The macro can be viewed as a "black box", in which the internal workings of the macro are largely irrelevant to the end user. Each macro can provide an efficient, optimized version of the particular circuit function implemented by that macro. For example, a macro can be created and refined with respect to the primitives available for use on the target PLD and the architecture of the target PLD.

The phrase "macro inference" generally refers to a process in which portions of a circuit design are replaced with suitable macros, e.g., a macro that is functionally equivalent to the portion of the circuit design that is being replaced. As such, macro inference provides one way in which circuit designs can be optimized, whether in terms of area usage, speed, timing, power consumption, or the like.

SUMMARY

The present invention relates to implementing circuit designs using programmable logic devices (PLDs) and macro inference techniques. One embodiment of the present invention can include a method of macro inference within an Electronic Design Automation (EDA) tool. The method can include translating a hardware description language (HDL) template into a macro template, translating a circuit design into a format corresponding to the macro template, and matching a portion of the translated circuit design with the macro template. The portion of the circuit design matching the macro template can be replaced with a macro associated with the macro template. The resulting updated circuit design is then output, e.g., to a user, a computer file, or another EDA tool.

Translating the HDL template can include parsing the HDL template and processing the HDL template through a register-transfer-level (RTL) elaboration process. Translating the circuit design can include parsing the circuit design and processing the circuit design through an RTL elaboration process.

The format corresponding to the macro template, e.g., of the macro template, into which the circuit design is translated, can be selected to be a format that conforms to an internal data structure utilized by the EDA tool. Matching a portion of the translated circuit design with the macro template can include comparing the macro template with the translated circuit design.

The macro template can be stored within a macro template library comprising a plurality of macro templates. The macro template can be added to the macro template library without recompiling the EDA tool.

The method also can include first providing the HDL template. An updated version of the circuit design including the macro also can be generated.

Another embodiment of the present invention can include a method of macro inference within an EDA tool. The method can include specifying a plurality of templates written in an HDL, converting the plurality of HDL templates into a plurality of macro templates, and storing the plurality of macro templates in a macro template library, wherein each of the plurality of macro templates is associated with a macro. The method also can include converting a circuit design into a format that conforms to an internal data structure utilized by the EDA tool and identifying a portion of the converted circuit design that matches a selected macro template from the plurality of macro templates. An updated circuit design can be generated by replacing the portion of the converted circuit design that matches the selected macro template with a macro associated with the selected macro template, and the updated circuit design is output, e.g., to a user, a computer file, or another EDA tool.

Converting the plurality of HDL templates can include parsing each of the plurality of HDL templates and processing each of the plurality of HDL templates through an RTL elaboration process. Converting the circuit design can include parsing the circuit design and processing the circuit design through an RTL elaboration process.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to macro inference in the context of circuit design using an Electronic Design Automation (EDA) tool. More particularly, hardware description language (HDL) templates can be processed by an EDA tool to generate macro templates. The macro templates can be specified according to the internal data structure, or format, utilized and understood by the EDA tool. The EDA tool tries to match portions of a circuit design with the macro templates. When a match is found, the portion of the circuit design that matches a macro template can be replaced with a macro that is associated with the matched macro template.

Utilizing macro templates generated from HDL templates provides several advantages over conventional techniques dealing with macro inference. With respect to conventional macro inference techniques, if a change to a process such as parsing or register-transfer-level (RTL) elaboration is implemented in the EDA tool, the internal data structure utilized by the EDA tool will likely change as well. Such changes often lead to situations in which particular macro templates are no longer recognized by the EDA tool within circuit designs. Since the macro templates in conventional EDA tools are created from scratch, and not converted or translated from another source, it is necessary to update macro templates independently of the parsing and/or RTL elaboration processes. This ensures that each macro template conforms to any changes made to the internal data structure utilized by the EDA tool which may have been introduced as a result of changes to various processing algorithms. This updating process can be time consuming and tedious. Moreover, anytime a new macro template is added to the EDA tool, the EDA tool must be recompiled.

By generating macro templates from HDL templates, the macro templates are effectively guaranteed to be supported by the EDA tool, particularly since each HDL template is processed by the updated parsing and/or RTL elaboration process of the EDA tool itself. This conversion is automatic, requiring little, if any, manual intervention. Moreover, the addition of new macro templates does not require recompilation of the EDA source code as is the case with updating macro templates in conventional EDA tools. Rather, a new HDL template can be specified and processed through the macro template generation process, which is implemented by the EDA tool itself. The resulting macro template can be added to the macro template library. The use of HDL templates further allows users to specify macro templates using an established programming language without knowledge of the internal workings of the EDA tool.

Figure 1:
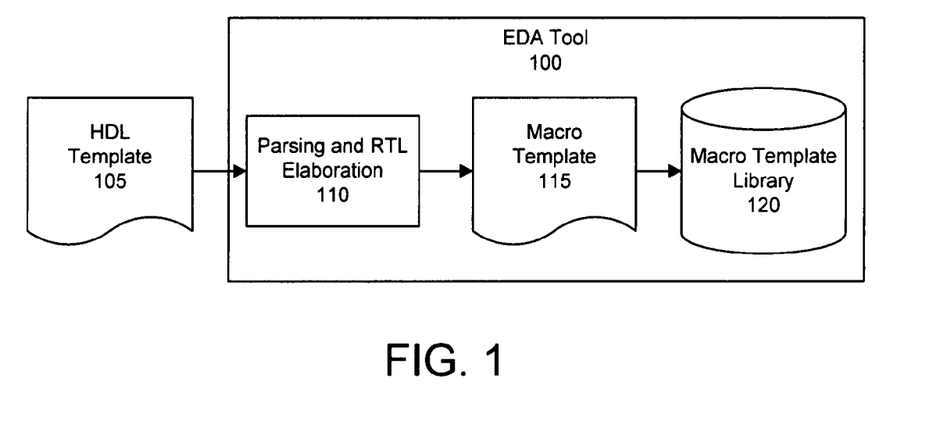
FIG. 1 is a diagram illustrating an Electronic Design Automation (EDA) tool that creates macro templates in accordance with one embodiment of the present invention.

FIG. 1 is a diagram illustrating an EDA tool 100 for creating macro templates in accordance with one embodiment of the present invention. In general, an EDA tool, can process a programmatic description of a circuit design, such as one specified using an HDL, to generate a bitstream. The bitstream, when loaded into a target PLD, configures the target PLD to implement the circuit design. The processing performed by an EDA tool can include, but is not limited to, synthesis, translation, packing, placement, and routing, where the resulting circuit design is transformed into a bitstream. It should be appreciated that the EDA tool can provide an output including an updated circuit design after one or more or each of the aforementioned stages of implementation. This updated circuit design, or portions thereof, can be stored, displayed, simulated, or otherwise output or provided in other formats.

One example of an EDA tool is System Generator for DSP™, available from Xilinx, Inc. of San Jose, Calif. (Xilinx). In addition to the functions described above, System Generator for DSP™ provides a wide range of functional blocks, as well as macros, that can be automatically compiled into a design suitable for a PLD, e.g., a field programmable gate array (FPGA). Each macro can be processed, or replaced with an implementation for the target PLD that includes the needed primitives available on the target PLD, e.g., look-up tables (LUTs), Digital Signal Processors (DSPs), and the like.

Referring again to FIG. 1, an HDL template 105 can be loaded into an EDA tool 100 and processed. The HDL template 105 can be an HDL description of a particular logic structure or function to be implemented on the target PLD as part of a circuit design. For example, an HDL template can specify structures and/or functions including, but not limited to, flip-flops, arithmetic operations (adders, multipliers, etc.), shift registers, random-access-memory (RAM) modules, read-only-memory (ROM) modules, and the like.

The EDA tool 100 can be placed in a macro template generation mode in which HDL templates are processed and translated into an internal data structure format used by the EDA tool 100. For example, the HDL template 105 can undergo parsing and RTL elaboration as represented by block 110 of the EDA tool 100. RTL elaboration, in general, refers to the process of translating a register-transfer-level model of hardware, e.g., written in an HDL at the register-transfer-level, into an optimized technology-specific gate-level implementation. This process can involve an initial translation of the HDL circuit description into a netlist with, or without, optimization.

The parsing and RTL elaboration block 110 processes the HDL template 105 and produces a macro template 115 as output. The macro template 115 is specified, or formatted, according to the internal data structure(s) utilized and understood by the EDA tool. In accordance with the macro template generation mode, rather than continue to process the macro template 115 through further stages of implementation, the macro template 115 can be stored within a macro template library 120 for future use in processing circuit designs.

Figure 2:
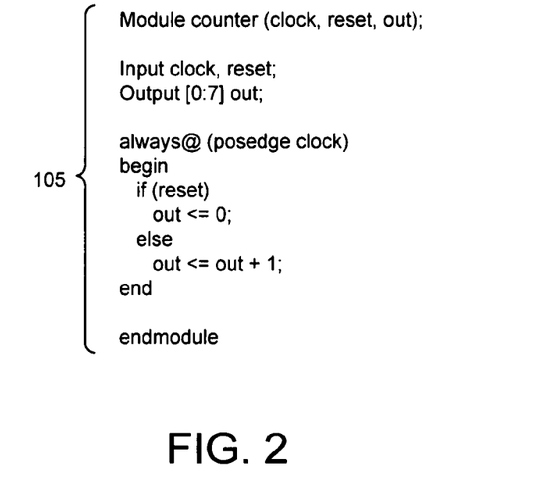
FIG. 2 is a diagram illustrating a hardware description language (HDL) template in accordance with another embodiment of the present invention.

FIG. 2 is an example of an HDL template in accordance with another embodiment of the present invention. More particularly, FIG. 2 illustrates one example of the HDL template 105 of FIG. 1. In this example, the HDL template 105 specifies a particular implementation of a counter module. The HDL template 105 specifies a counter with the following behavior and/or attributes: the counter has an eight bit output (outputs 0-7); the counter is able to count to a maximum value of 255 (2^(8-1)); the counter increments by 1 on each positive clock edge; and the counter, when reset, starts counting from zero.

In general, each HDL template corresponds to a single configuration of a logic function having specific behaviors and/or attributes. For example, as noted, the HDL template 105 specifies a counter configuration with specific attributes. Other HDL templates can specify different counter configurations, e.g., a counter having a higher maximum counter value, a counter that resets to a value other than zero, or a counter that switches values on the falling edge of the clock signal. For each different configuration of a counter that is to be identified within a circuit design and replaced with a suitable macro, a different HDL template can be created which specifies those attributes and/or behaviors.

Though an HDL template for a counter is used as an example, it should be appreciated that any of a variety of different HDL templates can be specified. As noted, HDL templates can be specified for logic structures including, but not limited to, flip-flops, arithmetic operations, shift registers, RAM modules, ROM modules, and the like. For each different configuration of such a structure, a different HDL template is specified.

Other attributes that can be specified as part of an HDL template can include, but are not limited to, the name of the macro to which the HDL template (and the resulting macro template) is associated and a property (switch) allowing the associated macro to be deactivated. Such properties can be carried forward through the parsing and RTL elaboration process such that the properties also are specified in the resulting macro template.

Figure 3:
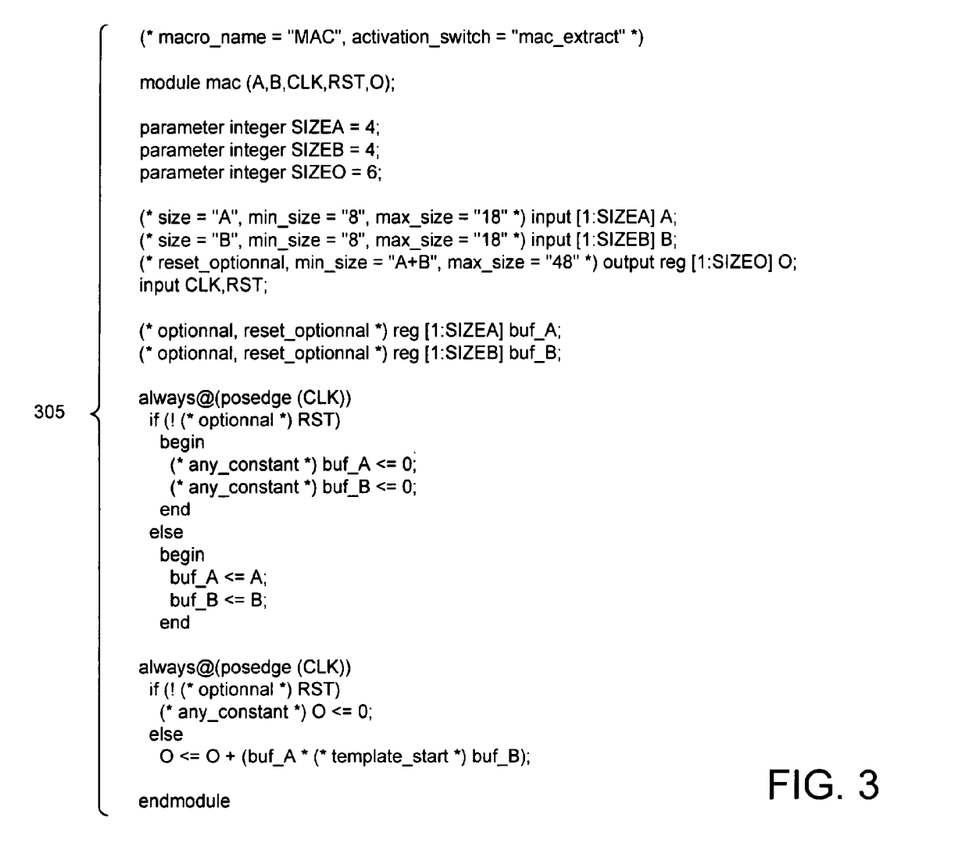
FIG. 3 is diagram illustrating another HDL template in accordance with another embodiment of the present invention.

FIG. 3 is an example of another HDL template in accordance with another embodiment of the present invention. FIG. 3 illustrates an example of an HDL template 305 in which the HDL language has been extended to specify minimum and/or maximum ranges as well as other attributes. As shown in FIG. 3, the HDL template entitled "MAC" specifies size ranges for inputs A and B as well as for the reset signal.

Figure 4:
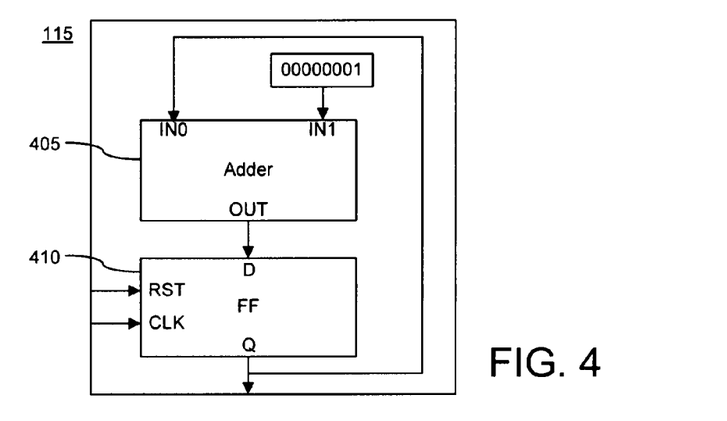
FIG. 4 is a diagram illustrating a macro template in accordance with another embodiment of the present invention.

FIG. 4 is a diagram illustrating an example of a macro template in accordance with another embodiment of the present invention. More particularly, FIG. 4 illustrates an example of the macro template 115 shown in FIG. 1. As noted, the HDL macro 105 is translated, or converted, via the parsing and RTL elaboration block 110 to generate the macro template 115. In general, the macro template 115 includes a more specific representation of the counter configuration specified by the HDL template 105. For example, the macro template 115 can specify particular structures, in this case an adder and a flip-flop, necessary to implement a counter and, further, which are available, or can be created from available primitives, on the target PLD. In this regard, the macro template 115 can be said to be "technology specific".

After parsing and RTL elaboration, the HDL template 105 has been translated into the internal data structure, or format, utilized by the EDA tool 100, e.g., the macro template 115. As shown, the macro template 115 includes an adder 405 and a D-type flip flop 410. The "reset" and "clock" signals are provided to the flip-flop 410. The output of the flip-flop 410 is fed back to the input of the adder 405 and summed with the constant value of "1".

The macro template 115 is added to a macro template library 120. The macro template 115 further can be associated with a particular macro, as can each macro template stored in the macro template library. When a circuit design is processed by the EDA tool 100, the circuit design is searched to identify any portions of the circuit design that match, or correspond to, a macro template stored in the macro template library.

In general, there is a one-to-one correspondence between HDL templates and macro templates. For example, there may be a plurality of counter macro templates A, B, C, and D, each specifying a different configuration of a counter. Each macro template A, B, C, and D can specify a counter having a different configuration, for example, in terms of count limit, reset conditions, the reset value, etc.

A plurality of macro templates can be associated with a single macro. Continuing with the prior example, each counter macro template A, B, C, and D, can be associated with the same counter macro. During implementation, when a portion of a circuit design is found to match a macro template, e.g., macro template A, the counter macro associated with macro template A replaces the matched portion of the circuit design. The counter macro is configured to implement the particular counter configuration specified by macro template A. Had macro template B been found to match a portion of the circuit design, the same counter macro would be used to replace the portion of the circuit design that matched macro template B. The counter macro, however, would be configured to implement the counter configuration specified by macro template B, rather than macro template A.

Figure 5:
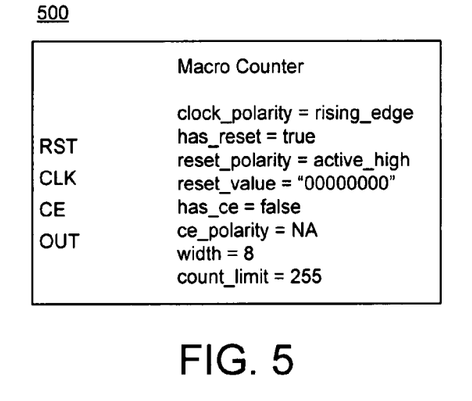
FIG. 5 is a diagram illustrating a macro in accordance with another embodiment of the present invention.

FIG. 5 is a diagram illustrating an exemplary macro 500 in accordance with another embodiment of the present invention. The macro 500 is an example of the macro that can be associated with the macro template 115 of FIG. 4. Upon identifying a portion of a circuit design that matches the macro template 115, the macro 500, configured as shown, can be inserted into the circuit design in place of the portion of the circuit design that was found to match the macro template 115. The values used for variables such as "reset_value" and "clock_polarity", for example, ensure that the macro template implements the particular counter configuration specified by macro template 115.

Figure 6:
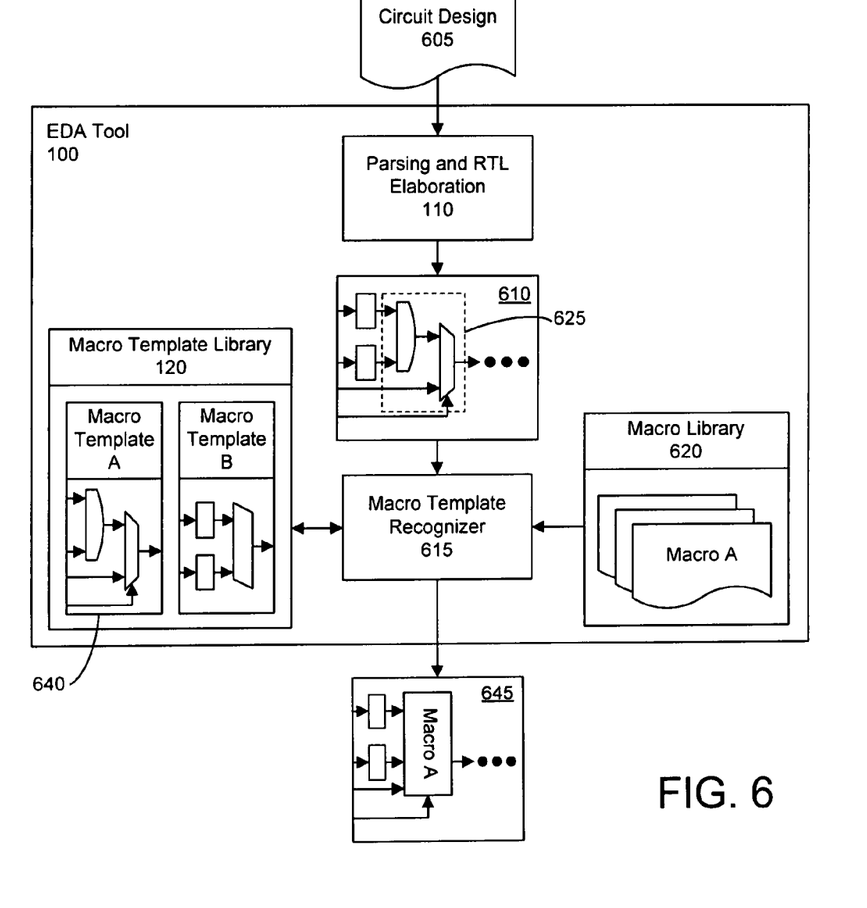
FIG. 6 is a diagram illustrating an EDA tool that performs macro inference in accordance with another embodiment of the present invention.

FIG. 6 is a diagram illustrating an EDA tool that performs macro inference in accordance with another embodiment of the present invention. The EDA tool 100 can be placed in a different operating mode for processing a user-specified, or other, circuit design. The macro template library 120 has been generated, with each macro template stored therein being associated with a macro in the macro library 620.

As shown, a circuit design 605 specified in an HDL can be loaded into the EDA tool 100. The circuit design can be processed through a parsing and RTL elaboration process as represented by block 110. The resulting circuit design 610 can be specified in the internal data structure utilized by the EDA tool 100. The format into which the circuit design 605 is translated can be the same as the format in which the macro templates located in the macro template library 120 have been translated.

The macro template recognizer 615 can process the circuit design 610. More particularly, the macro template recognizer 615 can search the circuit design 610 to determine whether any portion(s) of the circuit design 610 match one or more of the macro templates included in the macro template library 120. For each portion of the circuit design 610 that matches a macro template from the macro template library 120, that portion of the circuit design 610 can be replaced with a macro from the macro library 620 that is associated with the matched macro template.

In illustration, the macro template recognizer 615 can search the circuit design 610 and determine that a portion 625 of the circuit design 610 matches, or corresponds to, macro template 640. The macro template 640, which, for example, may specify a counter, is associated with macro A in the macro library 620. Accordingly, the macro template recognizer 615 can remove the matching portion 625 from the circuit design 610 and insert macro A in place of the removed portion 625. The EDA tool 100 thereby creates, or outputs, the revised circuit design 645 which includes macro A. As noted, macro A can be configured to implement the particular configuration of the logic function represented by macro template 640. The circuit design 645 can be processed further or stored for subsequent processing, e.g., implementation.

It should be appreciated that an EDA tool can reference, or include, multiple macro template libraries. One macro template library, for example, can include macro templates that have been optimized for conserving area of the target PLD. Another macro template library can include macro templates that have been optimized to reduce power consumption. Each macro template library can include macro templates that have been optimized for a particular purpose or combination of purposes, e.g., power consumption, area, timing, speed, etc. A user of the EDA tool can provide an input selecting the particular macro template library, or libraries, to be used during implementation. In this regard, the macro template generation mode of the EDA tool can be set to generate macro templates from HDL templates that are optimized for a particular purpose. The resulting macro templates can be added to the appropriate library or libraries.

Figure 7:
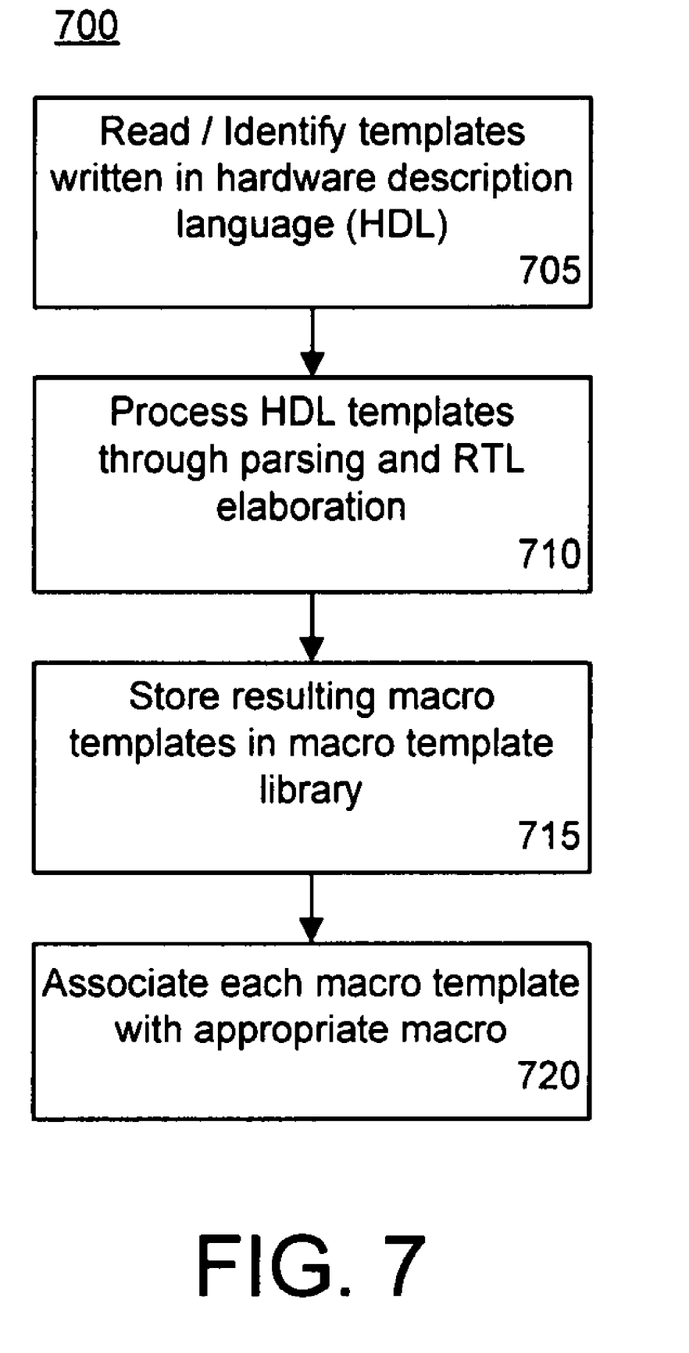
FIG. 7 is a flow chart illustrating a method of creating macro templates from HDL templates in accordance with another embodiment of the present invention.

FIG. 7 is a flow chart illustrating a method 700 of creating macro templates from HDL templates in accordance with another embodiment of the present invention. The method 700 can be implemented by an EDA tool as described herein with reference to FIGS. 1-6 and can begin in a state in which the EDA tool has been placed in a macro template generation mode. As noted, the EDA tool can be set to generate macro templates that have been optimized for one or more particular purposes, if so specified. Accordingly, in step 705, one or more HDL templates can be read into the EDA tool, or otherwise identified.

In step 710, the EDA tool can process each HDL template through a parsing and RTL elaboration process. As noted, this process effectively converts, or translates, each HDL template into a macro template. The macro templates are specified in a format that conforms to the internal data structure utilized by the EDA tool. The RLT elaboration process applied to the HDL template can vary according to a selected optimization, e.g., power, area, timing, or the like. Alternatively, a plurality of different macro templates can be generated for a given HDL template, where each macro template is optimized for a different purpose or combination of purposes. In step 715, the resulting macro template(s) can be stored in a macro template library that can be included as part of the EDA tool or be accessible by the EDA tool during operation. In step 720, each macro template can be associated with a particular macro. As noted, each macro template specifies a particular macro as well as a particular configuration for that macro.

Figure 8:
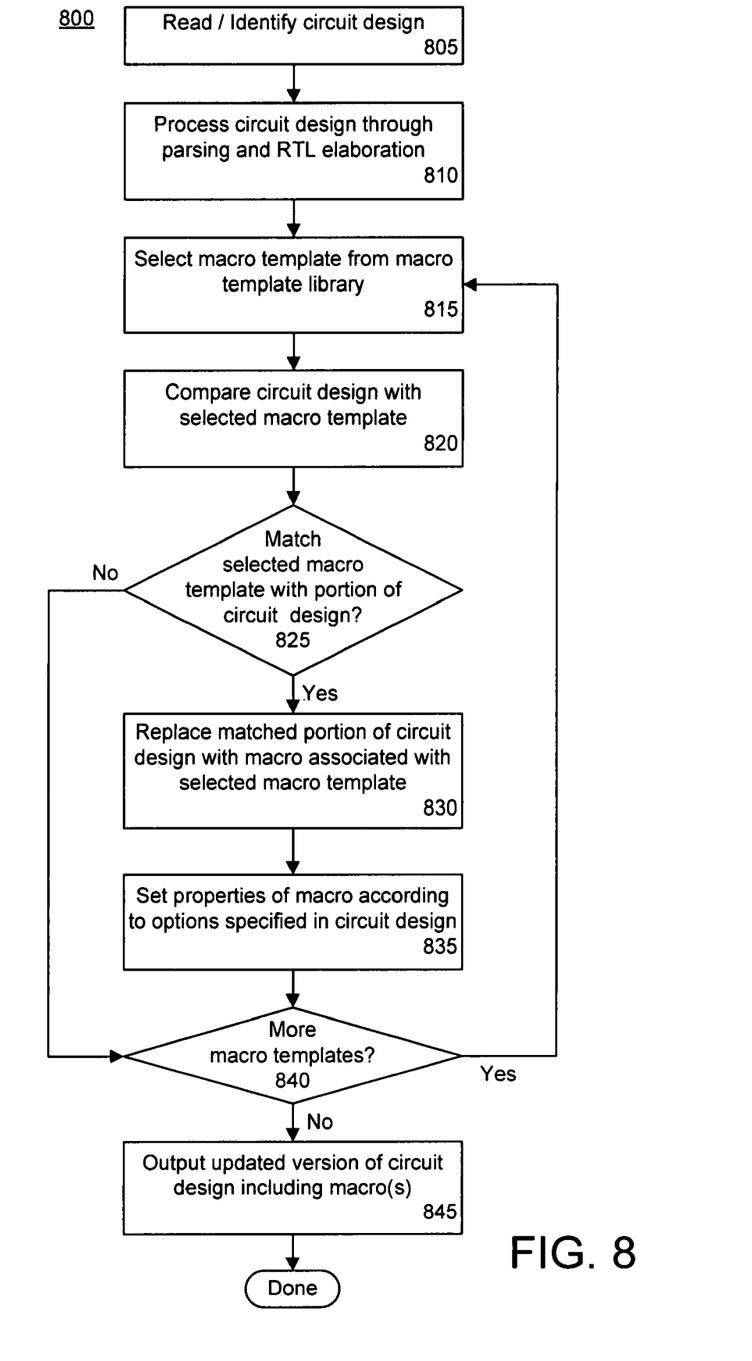
FIG. 8 is a flow chart illustrating a method of performing macro inference in accordance with another embodiment of the present invention.

FIG. 8 is a flow chart illustrating a method 800 of performing macro inference in accordance with another embodiment of the present invention. The method 800 can be implemented using an EDA tool as described herein with reference to FIGS. 1-7. The method 800 can begin in a state in which a macro template library has been developed from underlying HDL templates.

In step 805, a circuit design can be read into the EDA tool, or otherwise identified by the EDA tool. In step 810, the circuit design can be processed through a parsing and RTL elaboration phase. As noted, the resulting circuit design can be specified in a format that conforms to an internal data structure utilized by, and known by, the EDA tool. This internal format can be the same format in which the macro templates in the macro template library have been translated.

Beginning in step 815, the circuit design can be searched to determine whether the circuit design includes any portions that match macro templates. In step 815, a macro template can be selected from the macro template library. In step 820, the circuit design can be compared with the selected macro template. In step 825, a determination can be made as to whether a portion of the circuit design matches the selected macro template. If so, the method can proceed to step 830. If not, the method can proceed to step 840.

Continuing with step 830, the portion of the circuit design that matches the selected macro template can be replaced with the macro associated with the selected macro template. In step 835, one or more properties, or attributes, of the macro inserted into the circuit design in step 830 can be set. As noted, the attributes, which determine the configuration and behavior of the macro, are determined from, or specified by, the particular macro template that was matched, in this case the selected macro template.

In step 840, a determination can be made as to whether further macro templates remain in the macro library for which the circuit design is to be searched. If so, the method can loop back to step 815 to select a next macro template for which the circuit design can be searched. If no further macro templates remain, the method can proceed to step 845, where the updated version of the circuit design including any macros that were inserted, can be provided as output. The circuit design can be stored for later use or can be processed through one or more subsequent stages of an implementation flow or process, e.g., to ultimately generate a bitstream that can be loaded into a target PLD to configure the PLD to implement the circuit design. This updated circuit design, or portions thereof, can be stored, displayed, simulated, output or provided to a user, or otherwise made available to a user or designer.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

The present invention also can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program", "software", "application", "computer-usable program code", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e., open language. The term "coupled", as used herein, is defined as connected, although not necessarily directly, and not necessarily mechanically, e.g., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. Within a computer-based Electronic Design Automation (EDA) tool executing within a computer, a method of macro inference comprising:
   translating a hardware description language (HDL) template into a macro template using an elaboration process of the EDA tool;
   translating a circuit design into a format corresponding to the macro template using the elaboration process of the EDA tool;
   matching, using the EDA tool, a portion of the translated circuit design with the macro template;
   replacing the portion of the circuit design matching the macro template with a macro associated with the macro template using the EDA tool, wherein an updated circuit design is generated; and
   storing the updated circuit design.

2. The method of claim 1, wherein matching the portion of the translated circuit design with the macro template comprises comparing the macro template with the translated circuit design.

3. The method of claim 1, wherein translating the HDL template comprises:
   parsing the HDL template; and
   processing the HDL template through a register-transfer-level elaboration process.

4. The method of claim 1, wherein translating the circuit design comprises:
   parsing the circuit design; and
   processing the circuit design through a register-transfer-level elaboration process.

5. The method of claim 1, further comprising storing the macro template within a macro template library comprising a plurality of macro templates.

6. The method of claim 5, wherein the macro template is added to the macro template library without recompiling the EDA tool.

7. The method of claim 1, further comprising selecting the format corresponding to the macro template to be a format that conforms to an internal data structure utilized by the EDA tool.

8. The method of claim 1, further comprising selecting the elaboration process from a plurality of elaboration processes, wherein each of the plurality of elaboration processes is optimized for a particular purpose.

9. Within a computer-based Electronic Design Automation (EDA) tool executing within a computer, a method of macro inference comprising:
   selecting a plurality of templates written in a hardware description language (HDL);
   converting the plurality of HDL templates into a plurality of macro templates using an elaboration process of the EDA tool;
   storing the plurality of macro templates in a macro template library, wherein each of the plurality of macro templates is associated with a macro;
   converting a circuit design into a format that conforms to an internal data structure utilized by the EDA tool using the elaboration process of the EDA tool;
   identifying a portion of the converted circuit design that matches a selected macro template from the plurality of macro templates using the EDA tool;
   generating, using the EDA tool, an updated circuit design by replacing the portion of the converted circuit design that matches the selected macro template with a macro associated with the selected macro template; and
   outputting the updated circuit design.

10. The method of claim 9, wherein converting the plurality of HDL templates comprises:
    parsing each of the plurality of HDL templates; and
    processing each of the plurality of HDL templates through a register-transfer-level elaboration process.

11. The method of claim 9, wherein converting the circuit design comprises:
    parsing the circuit design; and
    processing the circuit design through a register-transfer-level elaboration process.

12. A computer program product comprising:
    a computer-usable medium having computer-usable program code for an Electronic Design Automation (EDA) tool that performs macro inference, said computer program product including:
    computer-usable program code that translates a hardware description language (HDL) template into a macro template using an elaboration process of the EDA tool;
    computer-usable program code that translates a circuit design into a format corresponding to the macro template using the elaboration process of the EDA tool;
    computer-usable program code that matches a portion of the translated circuit design with the macro template;
    computer-usable program code that replaces the portion of the circuit design matching the macro template with a macro associated with the macro template, wherein an updated circuit design is generated; and computer-usable program code that outputs the updated circuit design.

13. The computer program product of claim 12, wherein the computer-usable program code that matches a portion of the translated circuit design with the macro template comprises computer-usable program code that compares the macro template with the translated circuit design.

14. The computer program product of claim 12, wherein the computer-usable program code that translates the HDL template comprises:

computer-usable program code that parses the HDL template; and computer-usable program code that processes the HDL template through a register-transfer-level elaboration process.

15. The computer program product of claim 12, wherein the computer-usable program code that translates the circuit design comprises:

computer-usable program code that parses the circuit design; and computer-usable program code that processes the circuit design through a register-transfer-level elaboration process.

16. The computer program product of claim 12, further comprising computer-usable program code that stores the macro template within a library comprising a plurality of macro templates without recompiling the EDA tool.

17. The computer program product of claim 12, further comprising computer-usable program code that selects the format corresponding to the macro template to be an internal format utilized by the EDA tool.

18. The computer program product of claim 12, further comprising selecting the elaboration process from a plurality of elaboration processes, wherein each of the plurality of elaboration processes is optimized for a particular purpose.

\* \* \* \* \*